United States Patent [19]
Pelc et al.

[11] Patent Number: 5,093,620
[45] Date of Patent: Mar. 3, 1992

[54] ENCODING FOR NMR PHASE CONTRAST FLOW MEASUREMENT

[75] Inventors: Norbert J. Pelc, Los Altos; Gary H. Glover, Menlo Park, both of Calif.

[73] Assignee: General Electric, Milwaukee, Wis.

[21] Appl. No.: 564,945

[22] Filed: Aug. 9, 1990

[51] Int. Cl.⁵ .................................................. G01R 33/20
[52] U.S. Cl. ................................. 324/306; 324/300
[58] Field of Search .............. 324/300, 306, 307, 309, 324/318, 322; 128/653 R, 653 A, 653 AF

[56] References Cited

U.S. PATENT DOCUMENTS

| | | | |
|---|---|---|---|
| 3,191,119 | 6/1965 | Singer | 324/306 |
| 3,419,793 | 12/1968 | Genthe et al. | 324/306 |
| 3,559,044 | 1/1971 | Vander Heyden | 324/306 |
| 4,516,075 | 5/1985 | Moran | 324/309 |
| 4,516,582 | 5/1985 | Redington | 128/653 |
| 4,532,473 | 7/1985 | Wehrli | 324/306 |
| 4,574,239 | 3/1986 | Singer | 324/306 |
| 4,609,872 | 9/1986 | O'Donnell | 324/306 |
| 4,621,234 | 11/1986 | Caprihan | 324/306 |
| 4,629,987 | 12/1986 | King et al. | 324/306 |
| 4,683,431 | 7/1987 | Pattany et al. | 324/306 |
| 4,689,560 | 8/1987 | Naylor et al. | 324/306 |
| 4,777,957 | 10/1988 | Wehrli | 128/653 |
| 5,022,397 | 6/1991 | Dumoulin | 128/653 AF |

Primary Examiner—Michael J. Tokar
Attorney, Agent, or Firm—Quarles & Brady

[57] ABSTRACT

In an NMR system a method for measuring the motion of spins moving in an unknown direction includes four separate measurement cycles. The first cycle establishes a reference phase and each of the subsequent three measurement cycles includes motion encoding field gradients for measuring motion along respective pairs of Cartesian coordinates. All four measurements are combined to calculate each of the motion components along x, y and z coordinates.

9 Claims, 4 Drawing Sheets

ENCODING FOR NMR PHASE CONTRAST FLOW MEASUREMENT

BACKGROUND OF THE INVENTION

The field of the invention is nuclear magnetic resonance imaging methods and systems. More particularly, the invention relates to a method for measuring flow and for producing NMR images of flowing or moving subjects.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spinlattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude, duration and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or a spin-echo signal.

The preferred embodiments of the invention will be described in detail with reference to a variant of the well known FT technique, which is frequently referred to as "spinwarp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980).

Briefly, the spin-warp technique employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793; and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed in to the volume or slice. Examples of this method are described in U.S. Pat. Nos. 4,574,239; 4,532,473; and 4,516,582.

A third technique for measuring motion or flow relies upon the fact that an NMR signal produced by spins flowing through a magnetic field gradient exhibits a phase shift which is proportional to velocity. For flow that has a roughly constant velocity during the measurement cycle the change in phase of the NMR signal is given as follows:

$$\Delta\phi = \gamma M_1 v \quad (1)$$

where $M_1$ is the first moment of the magnetic field gradient, $\gamma$ is the gyromagnetic ratio and $v$ is the velocity of the spins. To eliminate errors in this measurement due to phase shifts caused by other sources, it is common practice to perform the measurement at least twice with different magnetic field gradient moments. The difference in phase at any location between the two measurements is then as follows:

$$\Delta\phi = \gamma \Delta M_1 v \quad (2)$$

By performing two complete scans with different magnetic field gradient moments and subtracting the measured phases in the reconstructed images at each location in the data arrays, a phase map is produced which accurately measures the velocity of constantly moving spins in the direction of the gradient field. Thus, where the direction of flow is known, or the flow component in only one direction is desired, two measurement cycles are required.

When it is desired to measure the velocity of spins flowing in an unknown direction, more than two NMR measurement cycles are required. For example, in the conventional six point method two phase measurements are made along each Cartesian coordinate x, y and z to measure the velocity component vx, vy and vz along each axis. The total speed is then calculated as:

$$v = \sqrt{v_x^2 + v_y^2 + v_z^2} \quad (3)$$

where
$v_x = (\phi_{x1} - \phi_{x2})/\gamma\Delta M_{x1}$
$v_y = (\phi_{y1} - \phi_{y2})/\gamma\Delta M_{y1}$
$v_z = (\phi_{z1} - \phi_{z2})/\gamma\Delta M_{z1}$
$\Delta M_{x1}, \Delta M_{y1}, \Delta M_{z1}$ = change in motion encoding gradient first moment between each pair of measurements, along x, y, and z respectively,
$\phi_{x1}, \phi_{x2}, \phi_{y1}, \phi_{y2}, \phi_{z1}, \phi_{z2}$ = measured phase.

When compared to the two point measurement of known flow direction, the six-point measurement takes three times as long to perform and the signal-to-noise ratio in the measured velocity is neither improved nor diminished.

Flow can also be measured in an unknown direction using a simple four point measurement. The six point method is composed of three pairs of measurements, and each pair can be thought of as a reference measurement and a flow encoding measurement along one of the Cartesian coordinates. If the same reference measurement (no flow encoding) is used with all three flow encoding measurements, then only four measurements are required. If the four measurements are $\phi_{ref}, \phi_x, \phi_y, \phi_z$, then the measured velocity components are:

$$\begin{aligned} v_x &= (\phi_x - \phi_{ref})/\gamma\Delta M_{x1}; \\ v_y &= (\phi_y - \phi_{ref})/\gamma\Delta M_{y1}; \\ v_z &= (\phi_z - \phi_{ref})/\gamma\Delta M_{z1}. \end{aligned} \quad (4)$$

The total speed is then calculated according to equation (3).

While the simple four point method enables the total measurement time to be reduced by 33% over the six point method, measurement errors increase. This is due to the fact that a common reference measurement is used and the errors in each component measurement $v_x$, $v_y$ and $v_z$ are correlated. It can be shown that the variance ($\sigma^2$) of the simple four point method is twice that of the six point method when the flow direction has equal components along each measurement axis. In some directions the variance is lower than that of the 6 point method, and, averaged over all directions, the two methods have equal variance.

SUMMARY OF THE INVENTION

The present invention relates to an improved method for measuring the motion of spins in an unknown direction using an NMR system. More specifically, the present invention is a balanced four point NMR method for measuring motion in which the reference measurement cycle is encoded to measure a reference phase, each of three subsequent measurement cycles is encoded to measure motion along the vector sum of respective pairs of the three axes of motion, and the motion component along each axis of motion is calculated by combining the results of all four measurement cycles In addition, the total motion may be calculated by combining all motion components.

A general object of the invention is to measure motion in an unknown direction efficiently. The balanced four point method of the present invention provides a 33% reduction in measurement time over the six point method. In addition, while the invention requires twice the time as a two cycle method for measuring motion in a known direction, the signal-to-noise of a speed measurement wit balanced four point method is increased by a factor of $\sqrt{2}$ the two point method.

The advantages of the present invention are achieved primarily because all four measurements are combined with equal absolute weighting to calculate each motion component. If $\phi_0$ is the result of the reference measurement (for example, flow compensated), then the first measurement cycle $\phi_1$ encodes for motion along a first pair of coordinates x and y, the second measurement cycle $\phi_2$ encodes for motion along a second pair of coordinates x and z, and the third measurement cycle $\phi_3$ encodes for motion along the remaining pair of coordinates y and z. The respective motion components can then be calculated by combining these measurements as follows:

$$v_x = (-\phi_0 + \phi_1 + \phi_2 - \phi_3)/2\gamma\Delta M_{x1};$$
$$v_y = (-\phi_0 + \phi_1 - \phi_2 + \phi_3)/2\gamma\Delta M_{y1}; \quad (5)$$
$$v_z = (-\phi_0 - \phi_1 + \phi_2 + \phi_3)/2\gamma\Delta M_{z1}.$$

The total speed (v) can then be calculated by combining these motion components as set forth in equation (3). Note that all four measurements contribute equally to the calculation of each motion component.

As indicated above, the velocity of spins moving in a known direction can be measured in two cycles and calculated as follows:

$$v_1 = (\phi_1 - \phi_0)/\gamma\Delta M_{x1}$$

Assuming that the errors in the images produced by each data set are uncorrelated and have variance (in the real and/or imaginary component) of $\sigma^2$, the variance in the measurement of $v_1$ is as follows:

$$\sigma^2_{v1} = 2\sigma^2/M^2(\gamma\Delta M_1)^2 \quad (6)$$

where M is the magnitude of the NMR signal in the image.

In contrast, the variance of the velocity (v) measured according to the present invention may be expressed as follows if we assume that the four measurements have equal and uncorrelated variances, and that the three first moment changes $\Delta M_{x1}$, $\Delta M_{y1}$, and $\Delta M_{z1}$ are all equal to $\Delta M_1$:

$$\sigma_v^2 = \frac{\sigma^2((v_x + v_y + v_z)^2 + (v_x + v_y - v_z)^2 + (v_x - v_y + v_z)^2 + (-v_x + v_y + v_z)^2)}{4\pi^2 M^2 v^2 (\gamma\Delta M_1)^2} \quad (7)$$

When the terms inside the parentheses are expanded all the cross terms cancel and the result is $$\sigma^2_v = \sigma^2/\pi^2 M^2 (\gamma\Delta M_1)^2 \quad (8)$$

In other words, the variance in the measured velocity using the balanced four point method of the present invention is one half the variance in the measurement of velocity of known direction using the two point method (compare equations (6) and (8)).

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENTS

Figure 1:
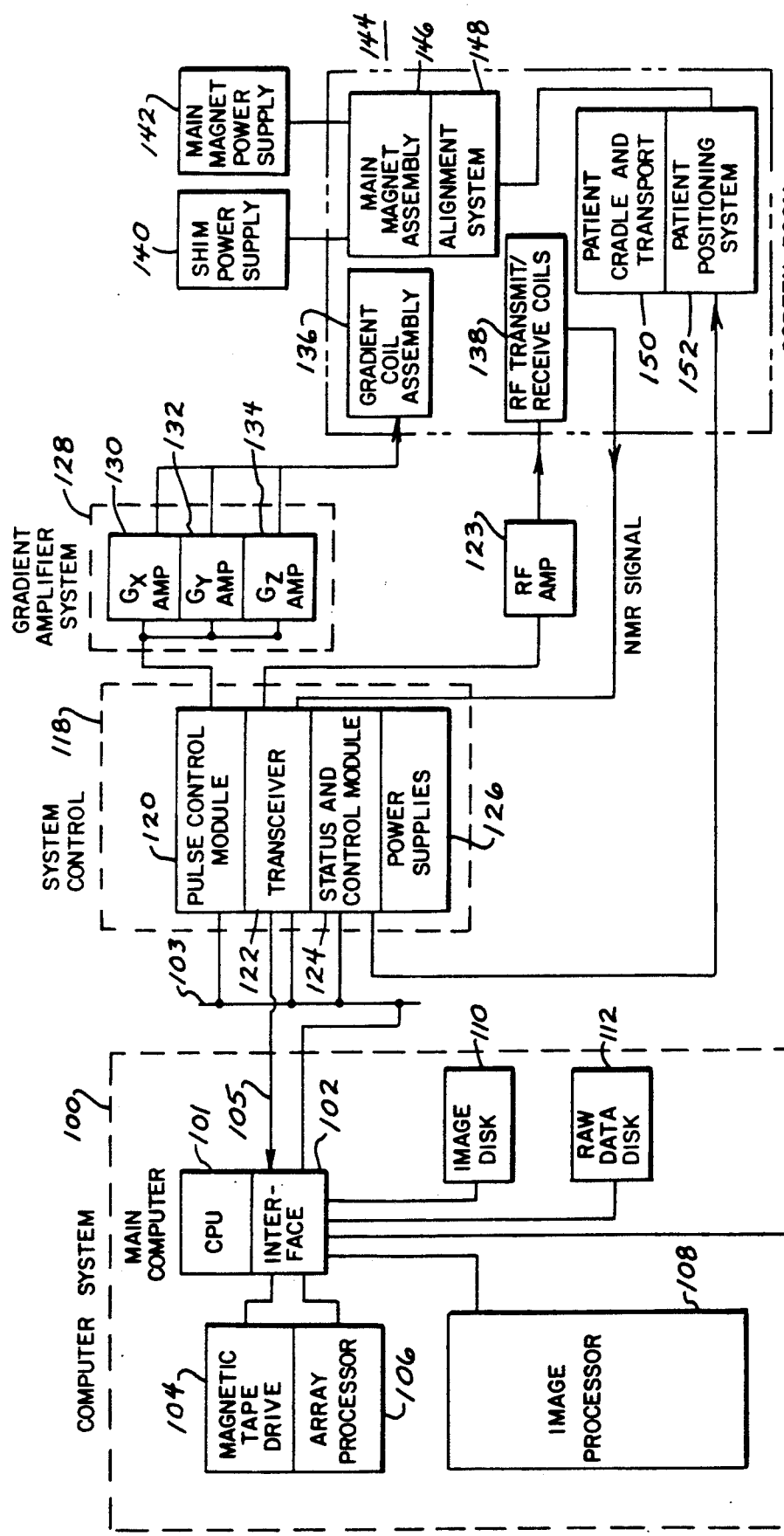
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of Gx, Gy and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
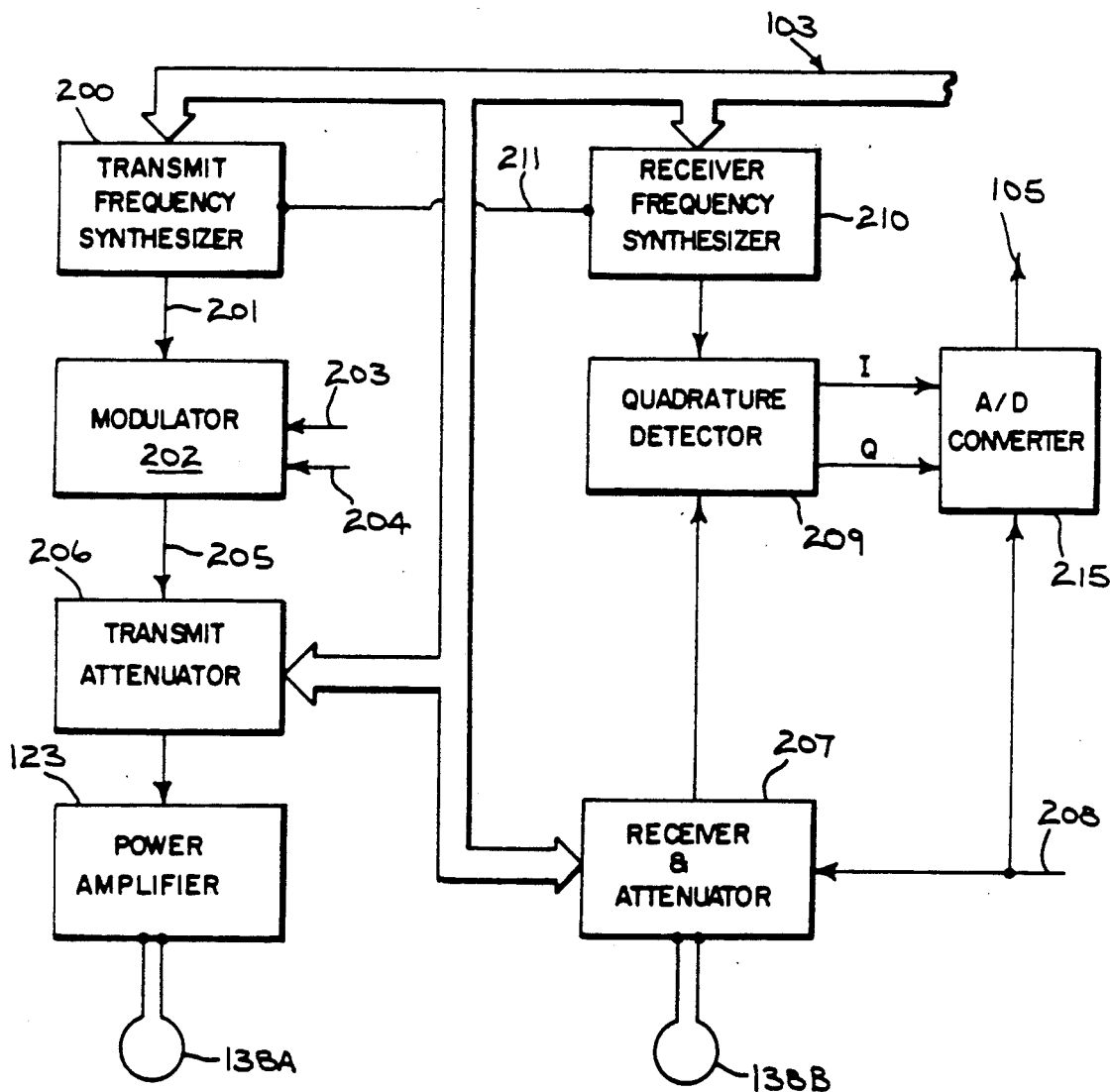
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 218 at a sample rate of 64 kHz throughout the acquisition period. A set of 256 digital numbers are simultaneously acquired for each I and Q component of the NMR signal, and these digital numbers are conveyed to the main computer 101 through the serial link 105. Each pair of numbers is thought of as a complex value equal to I+iQ.

Figure 3A:
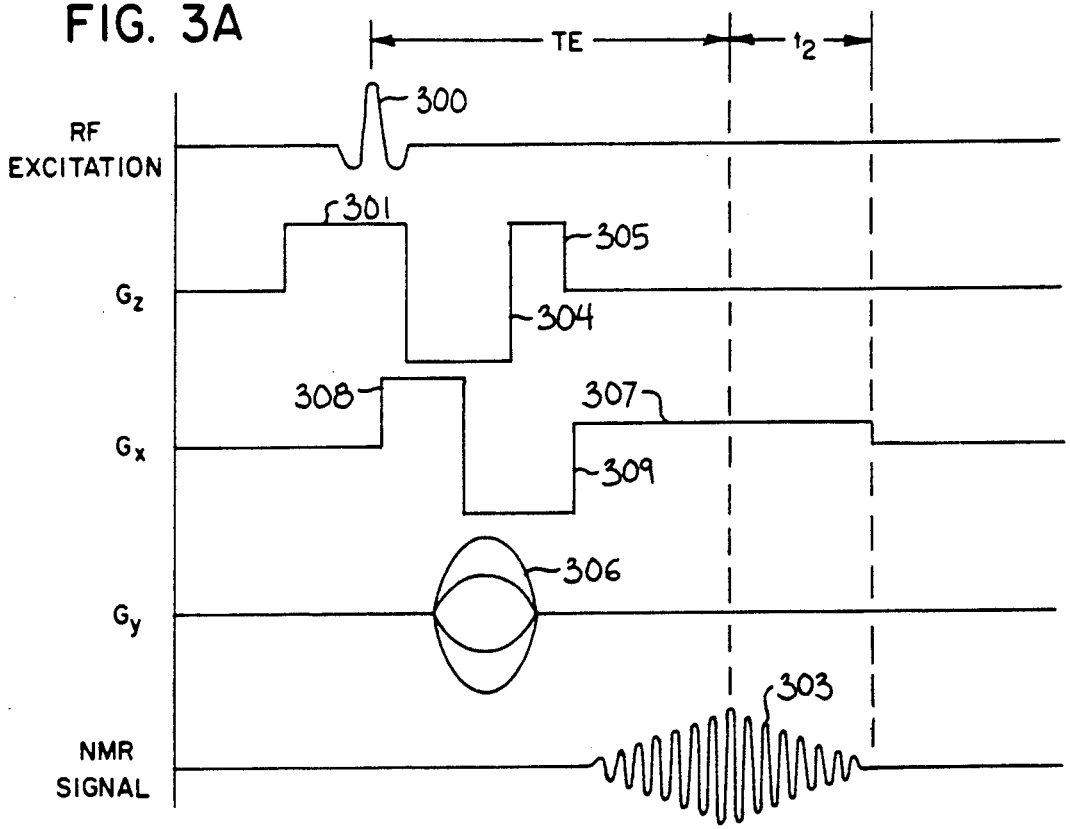
FIGS. 3A-3D are graphic representations of the NMR pulse sequences used to acquire data to measure velocity.

The NMR system of FIG. 1 performs a series of pulse sequences to collect sufficient NMR data to reconstruct the desired velocity image. Referring particularly to FIG. 3A, the first pulse sequence is a conventional first order moment nulled gradient echo sequence in which a selective RF excitation pulse 300 is applied to the subject in the presence of a $G_z$ slice select gradient pulse 301. The excitation pulse 300 has a flip angle of $\alpha$, with a typical value of $\alpha$ being 30°. To compensate the NMR signal 303 which is produced at a time TE after the excitation pulse 300 for the phase shifts caused by the slice select gradient pulse 301 and to desensitize the NMR signal 303 to velocity along the z axis, a negative $G_z$ gradient pulse 304 followed by a positive $G_z$ gradient pulse 305 are produced by the $G_z$ gradient coils as taught in U.S. Pat. No. 4,731,583. For example, one solution is to use a pulse 304 of the same width but opposite sign as the pulse 301 and the pulse 305 is one half the width and the same height as pulse 301. While the pulses 304 and 305 compensate for velocity along the z axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to localize the position of the spins producing the NMR signal along the y axis. Position along the x-axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ read gradient pulse 307 remains at a constant value during the entire scan. To produce the gradient echo 303 and to desensitize it to velocity along the x direction, gradient pulses 308 and 309 precede the gradient pulse 307 as taught in U.S. Pat. No. 4,731,583.

The NMR signal 303 is acquired by the system transceiver 122 and digitized into a row of 256 complex numbers which are stored in the memory of the main computer 101. For each value of the $G_y$ phase encoding gradient an NMR signal 303 is produced, acquired, digitized and stored in a separate row of 256 complex numbers. At the completion of the scan, therefore, a two-dimensional (256×256) matrix of complex numbers is stored in the computer 101. These NMR signals which are produced when no flow sensitizing gradients are applied may be Fourier transformed into a conventional NMR image. The image data produced from these flow compensated signals is referred to herein as the reference image data $S_0$ and they are used to calculate the reference phase image $\phi_0$ as will be described below.

Three additional measurement cycles are conducted to acquire the data needed to practice the present invention. These measurement cycles employ the pulse sequence of FIG. 3A with one important difference—they include motion encoding magnetic field gradients which sensitize the NMR signal 303 to velocity along a pair of the Cartesian coordinates. These motion encoding field gradients are produced by the same coils that produce the position encoding gradients $G_x$, $G_y$ and $G_z$ in the pulse sequence of FIG. 3A.

Figure 3B:
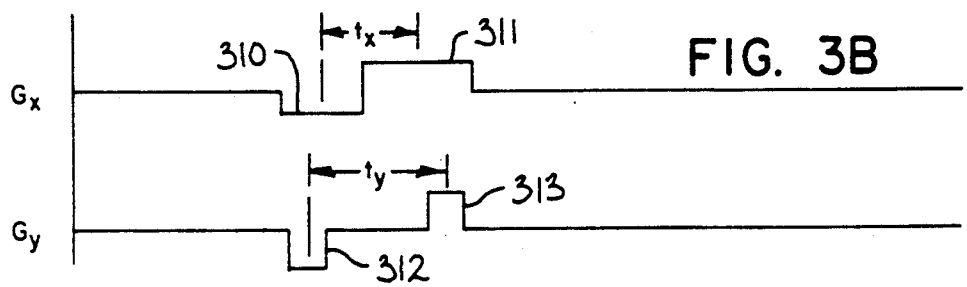

More speoifically, after the reference measurement is made using the pulse sequence of FIG. 3A, a first motion encoding measurement is made with the additional gradient pulses 310-313 shown in FIg. 3B. These additional gradient puless 310-313 are added to the motion compensated gradient pulses of FIG. 3A and they produce gradients along the respective x and y axes which are bipolar. These bipolar gradient pulses 310/311 and 312/313 sensitize the subsequent NMR signal 303 to velocity of spins moving along the x and y axes. the area, $A_x$, of each pulse 310 and 311 is the same and they are spaced apart by a time $t_x$. The change in the first moment is, therefore, $\Delta M_{x1} = A_x t_x$. Similarly, pulses 312 and 313 each have an area $A_y$, are spaced apart by time $t_y$, and produce a first moment change $\Delta M_{y1} = A_y t_y$. As discussed previously, therse first moment changes $\Delta M_{x1}$ and $\Delta M_{y1}$ determine the velocity sensitivity, which is typically controlled by adjusting the areas $A_x$ and $A_y$ respectively.

These motion encoding gradient pulses 310-313 are employed for a complete scan of the subject to produce a 256 ×256 array of complex numbers. This data set, when Fourier transformed, produces an image ($S_1$) which is processed as described below to produce the first incremented phase measurement $\phi_1$.

Figure 3C:
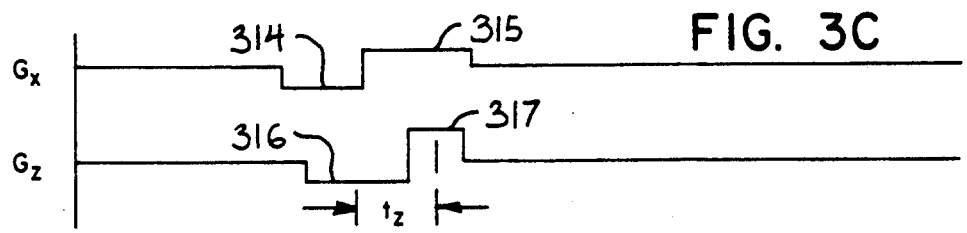

Referring particularly to FIGS. 3A and 3C, a second measurement cycle is carried out with motion encoding gradient pulses 314-317 applied to sensitize the NMR signal 303 for velocity along the x axis and z axis. Pulses 314 and 315 are substantially the same as pulses 310 asnd 311. Pulses 316 and 317 have equal areas $A_z$ and are spaced apart by a time $t_z$. They produce a change in first moment $\Delta M_{z1} = A_z t_z$. These motion encoding gradient pulses are added to the motion compensated gradient pulses of FIG. 3A. The resulting NMR signals are acquired to produce a 256×256 array of complex numbers which are transformed to produce an image data set $S_2$ that is used to calculate the second incremented phase measurement $\phi_2$.

Figure 3D:
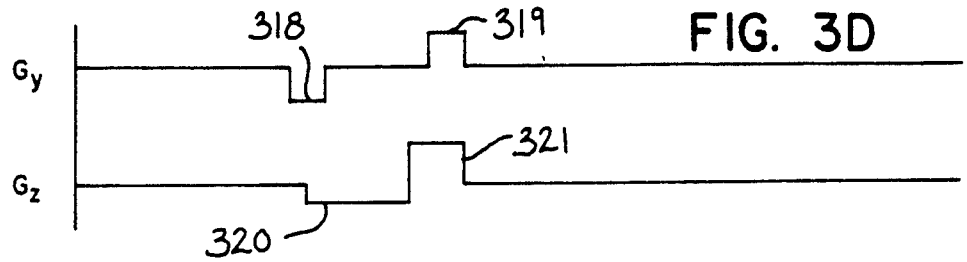
Figure 4:
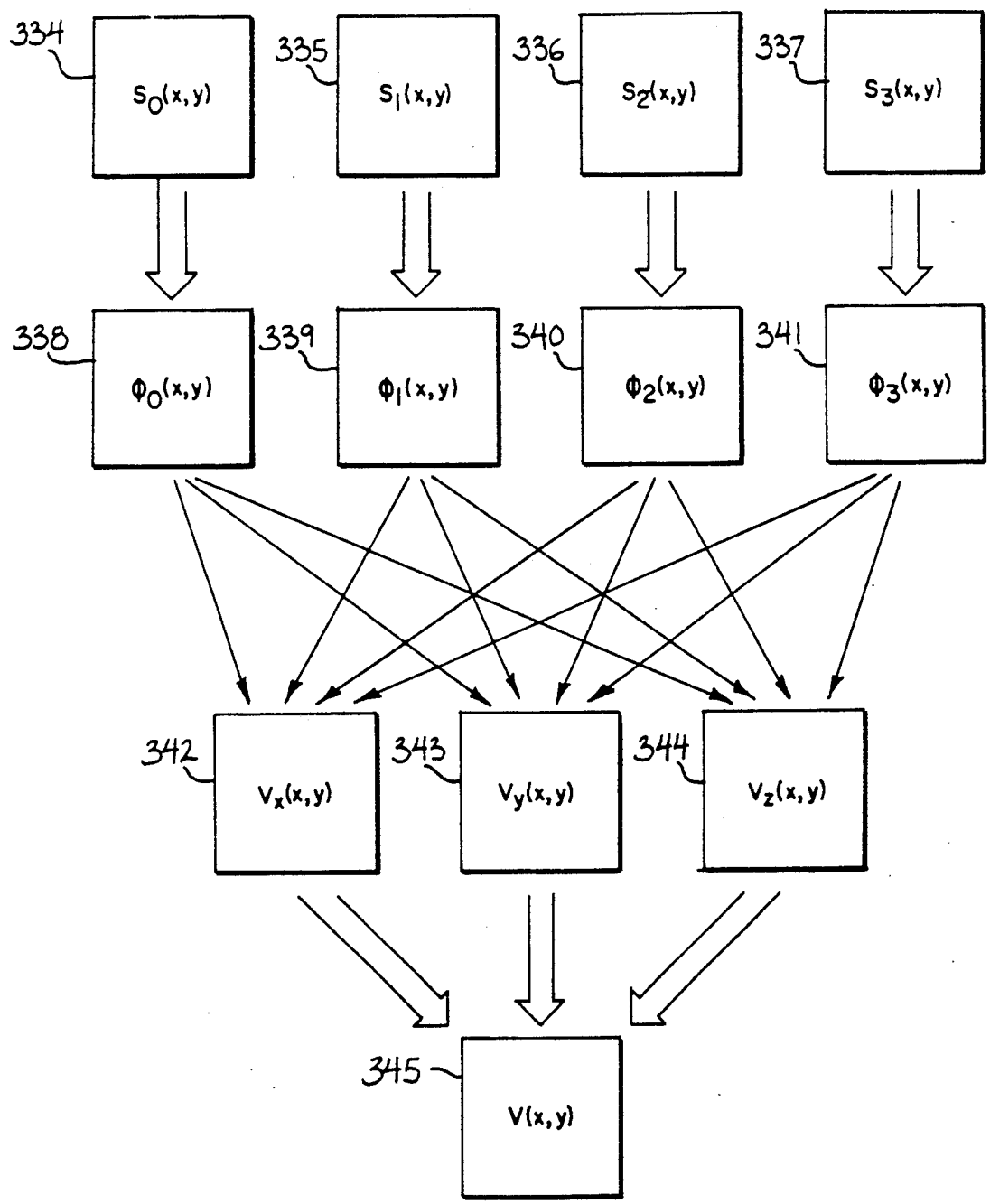
FIG. 4 is a pictorial representation of how a velocity image is reconstructed from NMR data acquired using the pulse sequences of FIG. 3.

Referring particularly to FIGS. 3A and 3D, the final measurement cycle is carried out with motion encoding gradient pulses 318-321 to sensitize for velocity along the y axis and the z axis, with the pulses 318 and 319 being substantially the same as 312 and 313, and the pulses 320 and 321 being substantially the same as the pulses 316 and 317. The gradient pulses 318-321 are added to the motion compensated gradient pulses of FIG. 3A to produce changes in first moment $\Delta M_{y1}$ and $\Delta M_{z1}$. The resulting signals are acquired to produce a 256×256 image array $S_3$ of complex numbers that are used to calculate the third incremented phase measurements $\phi_3$.

This completes the data acquisition steps of the method and the data processing steps are commenced using the four data sets $S_0$, $S_1$, $S_2$ and $S_3$.

It should be apparent to those skilled in the art that many other pulse sequences can be used to acquire the necessary data. In addition, the acquisition of the four data sets $S_0$, $S_1$, $S_2$ and $S_3$ can be interleaved such that four measurements are made at each phase encoding value, or "view" before the phase encoding value is incremented. Also, multiple measurements may be conducted at each phase encoding value for each data set to improve signal-to-noise or to cancel system errors as described in U.S. Pat. No. 4,443,760. And finally, there are many different ways to produce the gradient moment M1 for each phase measurement. For example, the gradient pulses can be shaped differently than those shown in FIGS. 3B-3D, or they may be separated in time to increase the first moment, or they may be more compact in their temporal duration. Also, spin echo sequences using 180° RF pulses may be used, and rather than using bipolar gradient pulses, both velocity encoding pulses may have the same polarity if they are produced on opposite sides of the 180° RF excitation pulse. It is also possible to include a non-zero gradient first moment in the reference phase measurement, and indeed, the magnitude of the gradient first moment for each sequence can be cut in half if the pulses used for the reference phase measurement have a first moment $-\Delta M_{x1}/2$, $-\Delta M_{y1}/2$, and $-\Delta M_{z1}/2$ along each of the three Coordinates. The important factor is that, for each axis, the gradient waveform is changed so as to alter the first moment by $\Delta M_1$ while not changing the net total area of the gradient pulses (the zeroth moment) at the time TE. The processing of the four data sets $S_0$, $S_1$, $S_2$ and $S_3$ to produce velocity images is illustrated in FIG.

4. All of the processing is carried out in the computer system 100 under the direction of instructions in a stored program. The four data sets for the complex images $S_0$, $S_1$, $S_2$ and $S_3$ produced by Fourier transforming the acquired NMR data are stored as arrays of complex numbers $S_0(x,y)$, $S_1(x,y)$, $S_2(x,y)$ and $S_3(x,y)$ indicated by blocks 334-337.

Each element of the arrays 334-337 is a complex number which contains information about the magnitude and phase of the NMR signals produced by the spins at a location, or pixel, in space in each of the four experiments. The phase of the NMR signal is calculated for each element of the arrays 334-337 as follows:

$$\phi = \tan^{-1}\left(\frac{Q}{I}\right) \quad (9)$$

where
Q = "imaginary" component of the complex number at a pixel, and
I = "real" component of the measured value.

The arc tangent function used in equation (9) is preferably a four quadrant arc tangent such as "ATAN2" in the FORTRAN computer language.

As a result of these computations four 256×256 phase arrays 339-341 are produced to provide phase measurements $\phi_0(x,y)$, $\phi_1(x,y)$, $\phi_2(x,y)$ and $\phi_3(x,y)$.

The phase measurements $\phi_0(x,y)$ are the NMR phase at each pixel in the first (e.g. flow compensated) experiments (FIG. 3A). These values are usually not zero due to effects such as $B_0$ inhomogeneity, RF penetration effects, pulse sequence tuning, and whatever motion encoding is produced by the gradient pulses used in the pulse sequence of FIG. 3A. The subsequent measurements of $\phi_1$, $\phi_2$ and $\phi_3$ are also subject to these effects. However, they also contain phase components which are due to the incrementally applied motion encoding gradient pulses of FIGS. 3B, 3C and 3D and the velocity of the spins along the x, y, and z axes. By combining the phase values $\phi_0$, $\phi_1$, $\phi_2$, and $\phi_3$ in the following manner, the three velocity components of the spins at each pixel of the image can be calculated.

For each point (x,y) in space the spin velocity components $V_x$, $V_y$ and $V_z$ are calculated using the following formulas:

$$V_x = (-\phi_0 + \phi_1 + \phi_2 - \phi_3)/2\gamma\Delta M_{x1} \quad (10)$$

$$V_y = (-\phi_0 + \phi_1 - \phi_2 + \phi_3)/2\gamma\Delta M_{y1} \quad (11)$$

$$V_z = (-\phi_0 - \phi_1 + \phi_2 + \phi_3)/2\gamma\Delta M_{z1} \quad (12)$$

where
$\Delta M_{x1}$, $\Delta M_{y1}$, and $\Delta M_{z1}$ = change in first moment of motion encoding gradient between reference phase and other phase measurements in each of the x, y and z axes.

These computations result in three 256×256 element arrays 342-344 which indicate at each point in space the respective x, y and z components of velocity. These components can be combined to produce a single array 345 which indicates the speed of spins v(x,y) at each point in space.

$$v(x,y) = \sqrt{(v_x(x,y))^2 + (v_y(x,y))^2 + (v_z(x,y))^2} \quad (13)$$

The values v(x,y) in the array 345 may be mapped to a display where the values v(x,y) control the intensity, or brightness of an image pixel.

The balanced four point method of the present invention measures the velocity of spins moving in any direction in twice the time required to measure spin velocity in a single, known direction. However, this increase in scan time is fully reflected as a concomitant improvement in signal-to-noise.

Other images can also be formed and displayed. For example, images of the separate velocity components $v_x$, $v_y$, or $v_z$ can be produced. Also, images of the direction of flow can be calculated and displayed using standard trigonometric approaches.

In the preferred embodiment, the first moment changes $\Delta M_{x1}$, $\Delta M_{y1}$, and $\Delta M_{z1}$ in each direction are the same. This is ideal if motion direction is unknown, but this need not be so. It is also possible to use different flow encoding strengths along each axis. For example, a stronger encoding could be used in the x direction by using a larger $\Delta M_{x1}$ (e.g. a larger $A_x$) in FIGS. 3B and 3C when $\phi_1$ and $\phi_2$ are measured. In such case, $v_x$ is calculated in accordance with equation (10). Use of a larger $\Delta M_{x1}$ yields a more precise measurement of velocity, but it has a smaller dynamic range before aliasing occurs. Aliasing occurs if any of the following conditions exist:

$$|\gamma v_x \Delta M_{x1} + \gamma v_y \Delta M_{y1}| > \pi \quad (14)$$
$$|\gamma v_x \Delta M_{x1} + \gamma v_z \Delta M_{z1}| > \pi$$
$$|\gamma v_y \Delta M_{y1} + \gamma v_z \Delta M_{z1}| > \pi$$

Subject to this constraint, the first moments can be selected to yield the most precise measurements along each axis of motion without aliasing due to high velocity.

The present invention may also be practiced without producing an image. That is, the imaging gradients in the pulse sequence of FIG. 3A may be eliminated and four measurements may be made as taught above. The velocity measurements thus made represent the motion of all spins in the region of sensitivity of the NMR system.

Also, it is possible to measure higher orders of motion with the present invention. For example, acceleration can be measured by replacing the waveforms of FIGS. 3B-3D with four lobed waveforms that have a second moment, but no first or zeroth moment. The four measurements are made and the phases are combined as follows to indicate acceleration:

$$a_x = (-\phi_0 + \phi_1 + \phi_2 - \phi_3)/(4\gamma\Delta M_{x2}) \quad (15)$$
$$a_y = (-\phi_0 + \phi_1 - \phi_2 + \phi_3)/(4\gamma\Delta M_{y2})$$
$$a_z = (-\phi_0 - \phi_1 + \phi_2 + \phi_3)/(4\gamma\Delta M_{z2})$$

Thus, a variety of parameters related to the motion of spins in three directions can be measured using the present invention. Also, the present invention can be employed with a 3 dimensional technique to yield 3 dimensional maps of motion.

We claim:
1. A method for measuring the motion of spins with an NMR system, the steps comprising:
 a) performing a reference NMR measurement cycle to produce a reference NMR signal $S_0$;
 b) performing a first NMR measurement cycle in which the magnetic field gradients produced by the NMR system include pulses which have a dif- ferent moment along a first and a second Cartesian coordinate than said reference NMR measurement cycle to sensitize the resulting NMR signal $S_1$ to the motion of the moving spins along said first and second Cartesian coordinates;

c) performing a second NMR measurement cycle in which the magnetic field gradients produced by the NMR system include pulses which have a different moment along the first Cartesian coordinate and a third Cartesian coordinate than said reference NMR measurement cycle to sensitize the resulting NMR signal $S_2$ to the motion of the moving spins along said first and third Cartesian coordinates.

d) performing a third NMR measurement cycle in which the magnetic field gradients produced by the NMR system include pulses which have a different moment along the second and the third Cartesian coordinates than said reference NMR measurement cycle to sensitize the resulting NMR signal $S_3$ to the motion of the moving spins along said second and third Cartesian coordinates; and e) combining the NMR signals $S_0$, $S_1$, $S_2$, and $S_3$ to calculate a value indicative of the motion of the spins.

2. The method as recited in claim 1 which further includes:

f) combining the NMR signals $S_0$, $S_1$, $S_2$, and $S_3$ to calculate a second value indicative Of the motion Of the spins along a first of said Cartesian coordinates;

g) combining the NMR signals $S_0$, $S_1$, $S_2$, and $S_3$ to calculate a third value indicative of the motion of the spins along a second of said Cartesian coordinates;

h) combining the NMR signals $S_0$, $S_1$, $S_2$, and $S_3$ to calculate a fourth value indicative of the motion of the spins along a third of said Cartesian coordinates; and i) combining the three values calculated in steps f), g) and h) to produce a value indicative of the motion of the spins in three dimensional space.

3. The method as recited in claim 1 in which the moments produced along the respective first, second and third Cartesian coordinates are first moments and the movement indicated by the value is the velocity of the moving spins along one of said Cartesian coordinates.

4. The method as recited in claim 1 in which the NMR signals are transformed to corresponding phase values $\phi_0$, $\phi_1$, $\phi_2$, and $\phi_3$; and in which the NMR signals are combined in step e) by arithmetically summing the phase values $\phi_1$ and $\phi_2$ and subtracting therefrom the phase values $\phi_0$ and $\phi_3$.

5. The method as recited in claim 2 in which the values are combined in step i) by calculating the square root of the sum of the squares of the respective second, third and fourth values.

6. A method for producing an image indicative of the motion of spins with an NMR system, the steps comprising:

a) acquiring a reference data set $S'_0$ by performing a reference NMR measurement cycle;

b) acquiring a first data set $S'_1$ by performing a NMR measurement cycle in which the magnetic field gradient produced by the NMR system includes pulses which have a different moment M along a first and a second Cartesian coordinate than the reference NMR measurement cycle to sensitize the resulting data set $S'_1$ to the motion of the spins along said first and second Cartesian coordinates;

c) acquiring a second data set $S'_2$ by performing a second NMR measurement cycle in which the magnetic field gradient produced by the NMR system includes pulses which have a different moment M along the first and third Cartesian coordinates than the reference NMR measurement cycle to sensitize the second data set $S'_2$ to the motion of the spins along said first and third Cartesian coordinates;

d) acquiring a third data set $S'_3$ by performing a third NMR measurement cycle in which the magnetic field gradient produced by the NMR system includes pulses which have a different moment M along the second and third Cartesian coordinates than the reference NMR measurement cycle to sensitize the third data set $S'_3$ to the velocity of the moving spins along said second and third Cartesian coordinates;

e) performing a Fourier transformation on each of said data sets $S'_0$, $S'_1$, $S'_2$, and $S'^{6hd\ 3}$ to produce corresponding transformed data sets $S_0(x,y)$, $S_1(x,y)$, $S_2(x,y)$, and $S_3(x,y)$;

f) calculating sets of phase values $\phi_0(x,y)$, $\phi_1(x,y)$, $\phi_2(x,y)$, and $\phi_3(x,y)$ from the respective transformed data sets $S_0(x,y)$, $S_1(x,y)$, $S_2(x,y)$, and $S_3(x,y)$; and g) calculating a set of motion components $m_x(x,y)$ in accordance with the equation:

$$m_x(x,y) = k(-\phi_0(x,y) + \phi_1(x,y) + \phi_2(x,y) - \phi_3(x,y))$$

where k is a constant value.

7. The method as recited in claim 6 which further includes h) calculating a set of motion components $m_y(x,y)$ in accordance with the equation $$m_y(x,y) = k(-\phi_0(x,y) + \phi_1(x,y) - \phi_2(x,y) + \phi_3(x,y));$$

i) calculating a set of motion components $m_z(x,y)$ in accordance with the equation $$m_z(x,y) = k(-\phi_0(x,y) - \phi_1(x,y) + \phi_2(x,y) + \phi_3(x,y));$$

j) calculating a set of spin motion values $m(x,y)$ in accordance with the following equation:

$$m(x,y) = \sqrt{(m_x(x,y))^2 + (m_y(x,y))^2 + (m_2(x,y))^2} \ ; \text{ and}$$

k) producing an image in which the brightness of each pixel is determined by a corresponding spin motion value $m(x,y)$.

8. The method as recited in claim 6 in which the reference data set $S'_0$ is acquired with an NMR measurement cycle having magnetic field gradient pulses which have a moment $-M/2$ along said first, second and third Cartesian coordinate.

9. The method as recited in claim 6 in which the motion that is imaged is velocity and the moment M is the first moment.

* * * * *

UNITED STATES PATENT AND TRADEMARK OFFICE
CERTIFICATE OF CORRECTION

PATENT NO.   : 5,093,620
DATED        : March 3, 1992
INVENTOR(S)  : Norbert J. Pelc and Gary H. Glover It is certified that error appears in the above-identified patent and that said Letters Patent is hereby corrected as shown below:

Column 1, line 37, "M2" should be --$M_z$--.

Column 1, line 50, "A 32" should be --A =--.

Column 2, line 53, "spinwarp" should be --spin-warp--.

Column 4, line 3, "$v_y = (\Delta_{y1} - \phi_{y2})/\gamma\Delta M_{y1}$" should be -- $v_y = (\phi_{y1} - \phi_{y2})/\gamma\Delta M_{y1}$ --.

Column 4, line 8, "$\phi x2$" should be --$\phi_{x2}$--.

Column 4, line 56, "cycles In" should be --cycles. In--.

Column 4, line 66, "wit" should be -- with --.

Column 4, line 67, "$\sqrt{}$ 2 the two" should be --$\sqrt{2}$ over the two--.

Column 6, line 37, "display The" should be --display. The--.

Column 7, line 2, "Gx, Gy and $G_z$" should be --$G_x$, $G_y$ and $G_z$ --.

Column 9, line 50, "speocifically" should be --specifically--.

Column 9, line 53, "FIg. 3B" should be --Fig. 3B--.

Column 9, line 54, "puless" should be --pulses--.

Column 9, line 59, "axes. the" should be --axes. The--.

Column 9, line 64, " $\Delta M_{y1}$-" should be --$\Delta M_{y1}$--.

UNITED STATES PATENT AND TRADEMARK OFFICE
CERTIFICATE OF CORRECTION

PATENT NO. : 5,093,620
DATED : March 3, 1992
INVENTOR(S) : Norbert J. Pelc and Gary H. Glover It is certified that error appears in the above-identified patent and that said Letters Patent is hereby corrected as shown below:

Column 9, line 65, "therse" shoulde be --these--.

Column 10, line 11, "310 asnd" should be --310 and--.

Column 10, line 20, "measurement" should be --measurements--.

Column 10, line 48, "M1" should be --$M_1$--.

Column 10, line 63, "Coordindate" should be coordinates--.

Column 10, line 67, begin new paragraph with "The processing of the. . .".

Column 11, line 30, "$\phi 0(x,y)$" should be --$\phi_0(x,y)$--.

UNITED STATES PATENT AND TRADEMARK OFFICE
CERTIFICATE OF CORRECTION

PATENT NO. : 5,093,620

DATED : March 3, 1992

INVENTOR(S) : Norbert J. Pelc and Gary H. Glover

It is certified that error appears in the above-identified patent and that said Letters Patent is hereby corrected as shown below:

In the Claims:

Column 13, line 29, "Of" should be --of--.

Column 13, line 30, "Of" should be --of--.

Column 14, line 25, "S'6hd3" should be $S_3'$--.

Column 14, line 39, "includes" should be --includes:--.

Column 14, line 63, "coordinate" should be --coordinates--.

Signed and Sealed this

Fourteenth Day of September, 1993

Attest:

BRUCE LEHMAN

Attesting Officer

Commissioner of Patents and Trademarks